United States Patent [19]

Fujikawa et al.

[11] Patent Number: 4,606,993

[45] Date of Patent: Aug. 19, 1986

[54] WATER DEVELOPABLE PHOTOSENSITIVE RESIN COMPOSITION

[75] Inventors: Junichi Fujikawa, Kyoto; Shigetora Kashio, Shiga, both of Japan

[73] Assignee: Toray Industries Incorporated, Tokyo, Japan

[21] Appl. No.: 822,947

[22] Filed: Jan. 27, 1986

Related U.S. Application Data

[63] Continuation of Ser. No. 622,836, Jul. 21, 1984, abandoned.

[30] Foreign Application Priority Data

Jul. 1, 1983 [JP] Japan ................. 58-118135

[51] Int. Cl.$^4$ ............................... G03C 1/68
[52] U.S. Cl. ................... 430/281; 430/909; 430/910; 522/109; 522/112
[58] Field of Search ............ 430/281, 909, 910; 522/109, 112

[56] References Cited

U.S. PATENT DOCUMENTS

| | | | |
|---|---|---|---|
| 3,630,746 | 12/1971 | Takimoto et al. | 430/281 |
| 3,801,328 | 4/1974 | Takimoto et al. | 430/909 |
| 3,898,287 | 8/1975 | Brutchen et al. | 430/281 |
| 3,961,961 | 6/1976 | Rich | 430/910 |
| 4,272,611 | 6/1981 | Vyvial et al. | 430/306 |
| 4,289,865 | 9/1981 | Wilson | 430/910 |
| 4,293,635 | 10/1981 | Flint et al. | 430/910 |
| 4,454,219 | 6/1984 | Yamadera et al. | 430/281 |

FOREIGN PATENT DOCUMENTS 0071789 2/1983 European Pat. Off.
0081964 6/1983 European Pat. Off.

OTHER PUBLICATIONS

Chemical Abstract, vol. 93, No. 7, p. 559, No. 141050y.

Primary Examiner—Jack P. Brammer
Attorney, Agent, or Firm—Scully, Scott, Murphy & Presser

[57] ABSTRACT

A photosensitive resin composition comprising components A, B and C described below is provided. The composition of the present invention is quite effectively usable for the preparation of photosensitive resin printing plates having excellent water developability, image reproducibility and printability. The composition comprises:

A. 100 parts by weight of a completely or partially saponified polyvinyl acetate having a degree of saponification of 50 to 100 mole %, B. 20 to 300 parts by weight of a photopolymerizable monomer having at least one ethylenically unsaturated bond in the molecule, and C. 1 to 50 parts by weight of a polymer obtained by homopolymerizing a polymerizable unsaturated monomer having the following groups (1) and (2) in the molecule or copolymerizing the same with another unsaturated monomer:

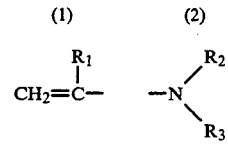

wherein $R_1$ represent H or $CH_3$ and $R_2$ and $R_3$ represent each an alkyl group having 1 to 10 carbon atoms.

8 Claims, No Drawings

WATER DEVELOPABLE PHOTOSENSITIVE RESIN COMPOSITION

This application is a continuation of application Ser. No. 622,836, filed July 21, 1984, now abandoned.

BACKGROUND OF THE INVENTION

1. Field of the Invention

The present invention relates to a water-developable, photosensitive resin composition containing a completely or partially saponified polyvinyl acetate having a high image-reproducibility.

2. Description of the Prior Art

Recently, photosensitive resin printing plates for relief printing, lithographic or intaglio processes having a structure comprising a metal or plastic base provided with a photopolymerizable, photosensitive resin layer on the surface thereof have been put to practical use. In using these printing plates, a negative or possitive original film having transparent areas is brought into intimate contact with the photosensitive resin layer and irradiated with actinic rays to effect the photopolymerization in the photosensitive resin layer in areas corresponding to the transparent areas of the original film and the resin in the non-polymerized areas is washed out with a suitable solvent to form a relief image on the base.

These photosensitive resin compositions have been used for various purposes including the preparation of printing plates, taking advantage of their photopolymerizability. Among the photosensitive resin compositions, it has been proposed to use a partially saponified polyvinyl acetate as a base resin, because it allows the resin in the non-polymerized areas to be washed out with neutral water to effect the development. Such compositions are disclosed in, for example, the specifications of U.S. Pat. Nos. 3,630,746, 3,801,328 and 4,042,386. These known compositions comprise a partially saponified polyvinyl acetate and a photopolymerizable monomer such as β-hydroxyethyl methacrylate. To realize an excellent water developability, the partially saponified polyvinyl acetate to be used should have an average degree of polymerization of as low as less than 500. However, when the partially saponified polyvinyl acetate having such a low degree of polymerization is used, the water resistance of photo-hardened areas becomes insufficient and, therefore, no excellent image reproducibility can be obtained easily. Further, since the degree of polymerization of the polymer base is low, cracks are formed in the relief or the relief is abraded seriously in the printing step. Thus, it has been difficult to realize both excellent water developability and excellent image reproducibility and printability in the prior art wherein the partially saponified polyvinyl acetate has been used as the base resin.

Further, a photosensitive resin composition containing a vinyl copolymer containing a dialkylamino group or its salt as the base resin has also been known. For example, the specification of Japanese Patent Laid-Open No. 192420/1982 discloses a photosensitive resin composition comprising a vinyl copolymer obtained by a copolymerization of a vinyl monomer containing a dialkylamino group, a copolymerizable vinyl monomer, a photosensitizer and an organic halogen compound. However, the resulting photosensitive printing plate has a water developability far inferior to that of known printing plates containing the partially saponified polyvinyl acetate, since the vinyl copolymer contained in the former has only a poor water solubility. The specification of Japanese Patent Laid-Open No. 199342/1983 didcloses a photosensitive resin composition comprising a vinyl copolymer (obtained by copolymerizing a hydroxyl group-containing vinyl monomer with a dialkylamino group-containing vinyl monomer) and a diazo compound. However, the water developability of the resulting photosensitive printing plate is also inferior to that of the known printing plates, since the water solubility of the vinyl copolymer is inferior to that of the partially saponified polyvinyl acetate having a low degree of polymerization. In addition, no excellent image reproducibility can be expected from the photosensitivity of the diazo compound. The specification of Japanese Patent Laid-Open No. 21736/1983 discloses a photosensitive resin composition containing as a base polymer a modified, partially saponified polyvinyl acetate having a cationic group including a dialkylamino group. In this polymer, however, the water solubility of the partially saponified polyvinyl acetate itself is reduced, since the absolute amount of the hydroxyl group which makes the partially saponified polyvinyl acetate water-soluble is reduced by the introduction of the cationic group. Accordingly, the development rate of the photosensitive printing plate with water is rather reduced.

As described above, it has been difficult to realize both excellent water developability and high image reproducibility and printability in the known photosensitive resin printing plates comprising the partially saponified polyvinyl acetate as the base polymer or the known photosensitive resin printing plates comprising the dialkylamino group-containing polymer as the base resin.

SUMMARY OF THE INVENTION

The present invention provides a photosensitive resin composition containing a completely or partially saponified polyvinyl acetate as the base resin and having excellent water developability, image reproducibility and printability. More particularly, the invention provides a water-developable, photosensitive resin composition useful for forming a photosensitive layer for relief printing or intaglio process.

The subject matter of the present invention resides in a photosensitive resin composition comprising the following components A, B and C:

A. 100 parts by weight of a completely or partially saponified polyvinyl acetate having a degree of saponification of 50 to 100 mole %, B. 20 to 300 parts by weight of a photopolymerizable monomer having at least one ethylenically unsaturated bond in the molecule and C. 1 to 50 parts by weight of a polymer obtained by homopolymerizing a polymerizable unsaturated monomer having groups of the following formulae (1) and (2) in the molecule or by copolymerizing this monomer with another unsaturated monomer:

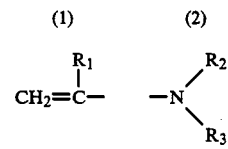

wherein $R_1$ represents H or $CH_3$ and $R_2$ and $R_3$ represent each an alkyl group having 1 to 10 carbon atoms.

DESCRIPTION OF THE PREFERRED EMBODIMENTS

The completely or partially saponified polyvinyl acetate being used as component A in the present invention has a degree of saponification of 50 to 100 mole %. The minimum degree of saponification is 50 mole %, since when it is less than 50 mole %, the water solubility of the saponified polyvinyl acetate is lowered seriously and no effective water developability can be obtained easily even by using the component C together. Though it is known that completely saponified polyvinyl acetate having a degree of saponification of 100 mole % has poor solubility in water at ambient temperature, it is possible to obtain practical water solubility by adding component C to said components A and B. Therefore, the maximum degree of saponification is 100 mole %.

For the above-described reasons, the degree of saponification should be in the range of 50 to 100 mole %. From the viewpoint of the rate of water developing, a degree of saponification of 70 to 95 mole % is preferred.

The molecular weight of the saponified polyvinyl acetate is not particularly limited. However, a low molecular weight is desirable from the viewpoint of water solubility and a high molecular weight is desirable from the viewpoint of the image reproducibility or toughness of the relief. Thus, the molecular weight of the completely or partially saponified polyvinyl acetate required for realizing the high water developability runs counter to that required for realizing the excellent image reproducibility and printability. Generally, those having an average degree of polymerization of less than 500 have been used, placing great importance on the developability with water. However, according to the present invention wherein the water developability is improved by the use of the component C, an excellent water developability can be obtained even by using the saponified polyvinyl acetate having an average degree of polymerization of above 500.

However, the water developability is reduced seriously even in the presence of the component C when the average degree of polymerization exceeds 3000. Therefore, a preferred average degree of polymerization of the completely or partially saponified polyvinyl acetate (component A) is in the range of 500 to 3000. A mixture of two or more components A having different degree of saponification or polymerization may also be used.

There may also be used a completely or partially saponified polyvinyl acetate obtained by reacting a terminal carboxyl group of the component A with an unsaturated epoxy compound such as glycidyl methacrylate to introduce a double bond into the terminal; a completely or partially saponified polyvinyl acetate copolymerized with another monomer such as allylsulfonic acid in an amount of as small as 1 to 10 mole %; and a partially saponified polyvinyl acetate modified by reacting the hydroxyl group with ethylene oxide or the like with a proviso that the degree of saponification calculated from the amount of the remaining hydroxyl group is in the range of 50 to 100 molar %. Particularly, a completely or partially saponified polyvinyl acetate having a double bond introduced therein by reacting its terminal group with glycidyl methacrylate is incorporated into the crosslinked structure formed by the photopolymerization of the photopolymerizable monomer (component B) by a chemical bond. The product thus obtained is particularly preferred, since a quite high image reproducibility can be obtained with the same.

The component A may be a mixture of the completely or partially saponified polyvinyl acetate with 1 to 20 wt. %, based on this saponified polymer, of a cellulose derivative such as methylcellulose having an average degree of polymerization of 300 to 3000 or another polymer such as polyethylene oxide having an average molecular weight of 1000 to 50,000.

The photopolymerizable monomers to be used as the component B in the present invention include all photopolymerizable monomers having at least a given compatibility with the component A. They include photopolymerizable acrylamide monomers such as monoacrylates and monomethacrylates having a hydroxyl group and 2 to 40 carbon atoms, e.g. 2-hydroxyethyl acrylate, 2-hydroxyethyl methacrylate, 2-hydroxypropyl acrylate, 2-hydroxypropyl methacrylate, 3-chloro-2-hydroxypropyl acrylate, and 3-chloro-2-hydroxypropyl methacrylate; polyfunctional acrylates and methacrylates having 5 to 100 carbon atoms and 2 to 6 double bonds obtained by reacting a dihydric to hexahydric alcohol having 2 to 80 carbon atoms, e.g. ethylene glycol, with an unsaturated carboxylic acid having 3 to 20 carbon atoms, e.g. acrylic or methacrylic acid; polyfunctional acrylates and methacrylates having a hydroxyl group, 7 to 80 carbon atoms and 2 to 6 double bonds prepared by reacting a dihydric to hexahydric glycidyl ether having 4 to 60 carbon atoms, e.g. ethylene glycol diglycidyl ether with an unsaturated carboxylic acid having 3 to 20 carbon atoms, e.g. acrylic or methacrylic acid; polyfunctional acrylates and methacrylates having a hydroxyl group, 7 to 60 carbon atoms and 2 to 6 double bonds prepared by reacting an unsaturated epoxy compound having 4 to 40 carbon atoms such as glycidyl methacrylate with an unsaturated carboxylic acid having 3 to 20 carbon atoms, e.g. acrylic or methacrylic acid; and polyfunctional acrylamides and methacrylamides having 6 to 84 carbon atoms and 2 to 6 double bonds obtained by condensing acrylamide, methacrylamide, N-methylolacrylamide, N-methylolmethacrylamide, diacetoneacrylamide, methylenebisacrylamide, N-methylolacrylamide or N-methylolmethacrylamide with a dihydric to hexahydric alcohol having 2 to 80 carbon atoms. Preferred photopolymerizable monomers are acrylic and methacrylic acid esters having a hydroxyl group and 1 to 6 double bonds and acrylamides and methacrylamides having 1 to 6 double bonds.

When the amount of the component B used is less than 20 parts by weight per 100 parts by weight of the completely or partially saponified polyvinyl acetate (component A), the density of the crosslinked structure formed by the photopolymerization is insufficient and, therefore, no satisfactory image reproducibility can be obtained. On the other hand, when the amount of the component B used exceeds 300 parts by weight, the density of the crosslinked structure formed by the photopolymerization becomes too large, resulting in a very brittle relief. Consequently, problems such as crack formation in the relief in the printing step are posed. For the above-described reasons, the amount of the photopolymerizable monomer B should be in the range of 20 to 300 parts by weight, preferably 50 to 150 parts by weight, per 100 parts by weight of the completely or partially saponified polyvinyl acetate.

Groups (1) and (2) in the component C are represented by the following general formulae:

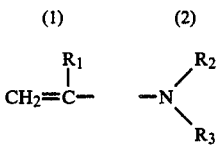

wherein $R_1$ represents a hydrogen atom or a methyl substituent and $R_2$ and $R_3$ represent each an alkyl group having 1 to 10 carbon atoms, such as methyl, ethyl, propyl, butyl, heptyl or hexyl group, preferably a lower alkyl group having 1 to 4 carbon atoms. Particularly when a high reactivity is desired, $R_2$ and $R_3$ may be each a lower alkyl group having a substituent such as methylol, hydroxyethyl or aminoalkyl group. The groups $R_2$ and $R_3$ may be the same or different.

The group (2) includes also a group in the form of a salt formed by the reaction of the dialkylamino group (2) with an acid such as hydrochloric, sulfuric, or acetic acid or a group in the form of a quaternary ammonium salt formed by the reaction of the group (2) with an alkyl halide or sulfuric ester.

The unsaturated monomers having the groups (1) and (2) in the molecule include the following compounds:
(a) dialkylaminoalkyl acrylates and methacrylates such as N,N-dimethylaminoethyl acrylate, N,N-dimethylaminoethyl methacrylate, N,N-diethylaminoethyl acrylate and N,N-diethylaminoethyl methacrylate as well as their salts and quaternary ammonium salts,
(b) dialkylaminoalkyl-acrylamides and -methacrylamides such as N-(2-dimethylaminoethyl)acrylamide and N-(2-dimethylaminoethyl)methacrylamide and their salts and quaternary ammonium salts, and
(c) dialkylaminovinyl ethers such as dimethylaminoethyl vinyl ether and methylaminopropyl vinyl ether as well as their salts and quaternary ammonium salts. Among these compounds, the dialkylaminoalkyl acrylates and methacrylates (a) are particularly preferably used, since they have a high copolymerizability with other unsaturated monomers.

The unsaturated monomer to be copolymerized with the above-mentioned monomers may be any copolymerizable monomer. They include, for example, acrylates and methacrylates having 2 to 40 carbon atoms and a hydroxyl group such as 2-hydroxyethyl acrylate, 2-hydroxyethyl methacrylate, 2-hydroxypropyl acrylate and 2-hydroxypropyl methacrylate; unsaturated carboxylic acids having 4 to 60 carbon atoms such as acrylic and methacrylic acids; and acrylamide and methacrylamide compounds such as acrylamide, methacrylamide, N-methylolacrylamide, dimethylacrylamide, diethylacrylamide and diacetoneacrylamide. The copolymerization ratio of the unsaturated monomer to the dialkylamino group-containing unsaturated monomer may be selected at will. However, to exhibit the effects required of the component C, it is preferred that the amount of the dialkylamino group-containing monomer is 10 to 100 wt. %. The polymerization may be effected by any of known methods. Among them, a solution catalytic polymerization method wherein an alcohol is used as the solvent is the easiest.

The polymer being used as the component C has a given water solubility in virtue of the effects of the dialkylamino group. However, the water solubility of the polymer is lower than that of the partially saponified polyvinyl acetate in many cases. It is to be noted, however, that the water developability of the photosensitive printing plate is improved remarkably when a combination of the completely or partially saponified polyvinyl acetate A with the component C is used. Though the mechanism of this phenomenon has not been elucidated yet, it is considered that when a highly crystalline, completely or partially saponified polyvinyl acetate is blended with a non-crystalline vinyl polymer C, the penetration of the developing water into a non-polymerized area is accelerated. Thus, by using the component C together, it becomes possible to use the completely or partially saponified polyvinyl acetate having a high degree of polymerization which could not be used easily in the prior art due to its insufficient water solubility. By using the completely or partially saponified polyvinyl acetate having a high degree of polymerization, quite excellent image reproducibility and printing durability can be obtained as described above. As a matter of course, when the component C is added to a completely or partially saponified polyvinyl acetate having a low degree of polymerization degree, a more excellent effect of improving the water developability can be expected. As the water developability is improved, the development time is shortened and, therefore, a possibility of disintegrating the relief by swelling with water is reduced and, consequently, the image reproducibility is improved. It has also been found that the dialkylamino group in the polymer C acts as a sensitization assistant to increase the sensitivity of the photosensitive composition and also to improve the image reproducibility thereof.

The amount of the component C to be used should be in the range of 1 to 50 parts by weight per 100 parts by weight of the completely or partially saponified polyvinyl acetate A.

When the amount of the component C is less than 1 part by weight, no effect of the component C to improve the water developability nor as the sensitization assistant can be obtained. When the amount of the component C exceeds 50 parts by weight, the resistance of the photopolymerized area to water is reduced to seriously reduce the image reproducibility. Therefore, the amount of the component C should be in the range of 1 to 50 parts by weight, preferably 2 to 20 parts by weight, per 100 parts by weight of the completely or partially saponified polyvinyl acetate A.

The photosensitive resin composition of the present invention may contain further a dihydric to hexahydric alcohol having 2 to 80 carbon atoms, such as ethylene glycol, diethylene glycol, triethylene glycol, glycerol, trimethylolpropane, trimethylolethane and triethanolamine as a compatibilization assistant for the completely or partially saponified polyvinyl acetate A and the photopolymerizable monomer B. These polyhydric alcohols have another effect of improving the flexibility of the photopolymerized area to prevent the crack formation in the relief. The polyhydric alcohol is used in an amount of up to 30 wt. % based on the photosensitive resin composition.

As the photosensitizers suitable for carrying out the photopolymerization reaction of the present invention rapidly, there may be used all of known photosensitizing compounds. They include, for example, benzoin alkyl ethers, benzophenones, anthraquinones, benzils, acetophenones and diacetyls. These photosensitizers are used in an amount in the range of 0.01 to 10 wt. %.

To improve the heat stability of the photosensitive composition of the present invention, any of known polymerization inhibitors may be used. Preferred thermal polymerization inhibitors include, for example, phenols, hydroquinones and catechols. These heat stabilizers are used in an amount in the range of 0.001 to 5 wt. % based on the total composition. Further, the composition may contain dye, pigment, surfactant, defoaming agent and U.V. absorber.

The composition of the present invention is prepared generally by dissolving the completely or partially saponified polyvinyl acetate A in a solvent mixture of water and an alcohol under heating, adding the photopolymerizable monomer B, the dialkylaminoalkyl group-containing polymer C, the photosensitizer and the heat stabilizer to the solution and stirring them thoroughly to obtain a mixture.

The photosensitive resin solution is thus obtained.

The photosensitive layer is formed from the above-mentioned solution mixture by, for example, distilling off a major part of the solvent, heating the residue to obtain a melt and extruding the same on the base to obtain a molding. Another process for preparing the photosensitive layer comprises forming a photosensitive sheet by a dry film-forming method and adhering the sheet to the base to form the photosensitive layer. Still another process comprises forming a film directly on the base by a dry film-forming method to form the photosensitive layer. The bases include plates of metals such as steel, stainless steel, aluminum and copper, plastic sheets such as polyester films and synthetic rubber sheets such as styrene/butadiene copolymer sheets. The photosensitive layer has a thickness of preferably 0.1 to 10 mm.

In forming a printing relief image with the photosensitive resin composition of the present invention, a negative or positive original image film is brought into close contact with the photosensitive layer prepared as above, irradiating the same with U.V. rays from a high pressure mercury lamp, ultra-high pressure mercury lamp, metal halide lamp, xenone lamp, carbon arc lamp or chemical lamp of generally about 300 to 400 m$\mu$ wavelength to insolubilize the same by the photopolymerization reaction. Then, a non-polymerized area is washed out by means of a spray-type developing device or brush-type developing device with neutral water to form the relief on the base.

From the photosensitive composition of the present invention, a printing plate having excellent water developability and high image reproducibility and printing durability but free from the stickiness can be obtained. This is because the water developability is improved by using the homopolymer C of the dialkylaminoalkyl group-containing unsaturated monomer or the copolymer obtained by copolymerizing this monomer with a hydroxyl group-containing unsaturated monomer or a (meth)acrylamide and, therefore, the use of the completely or partially saponified polyvinyl acetate having a relatively high degree of polymerization which could not be used easily due to its insufficient water developing velocity has become possible. The relief obtained by the photopolymerization of the component B using the completely or partially saponified polyvinyl acetate having a high degree of polymerization as the base polymer has a high water resistance and, therefore, a high image reproducibility can be obtained therefrom. As compared with a relief obtained by using a base polymer having a low degree of polymerization, the relief obtained as described above is tougher and problems such as crack formation during the printing are prevented.

The photosensitive resin composition of the present invention exhibits its maximum effects when it is used as a printing material for the relief printing. Further, it may be used also as a material for the lithographic, intaglio or screen printing or as a photoresist.

The following examples will further illustrate the present invention.

EXAMPLE 1

100 parts by weight of a partially saponified polyvinyl acetate having a degree of saponification of 80 mole % and average degree of polymerization of 600 was dissolved in 200 parts by weight of a solvent mixture of ethanol/water (weight ratio: 40/60) under heating to 80° C. Then, 70 parts by weight of the following compound obtained by an addition reaction of 1 mol of propylene glycol diglycidyl ether and 2 mol of acrylic acid was added as the photopolymerizable unsaturated compound to the solution and the mixture was stirred thoroughly:

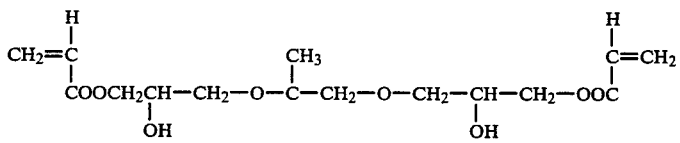

The mixture was further stirred thoroughly together with 10 parts by weight of a copolymer of diethylaminoethyl methacrylate and 2-hydroxyethyl acrylate (weight ratio: 1/1), 17 parts by weight of diethylene glycol, 3 parts by weight of dimethylbenzil ketal used as a photosensitizer and 0.1 part by weight of hydroquinone monomethyl ether used as a heat stabilizer. The resulting photosensitive resin solution was spread on a polyester film having 200$\mu$ thickness to which a polyester adhesive had been applied in such a manner that the thickness thereof after drying would be 950$\mu$. The resulting film was kept in a hot air oven at 60° C. for 5 h to completely remove the solvent. A solvent of ethanol/water (weight ratio: 50/50) was applied to the surface of the thus obtained photosensitive layer to form a thin coating layer. A polyester film having 100$\mu$ thickness which had been matted by a chemical etching was pressed thereon to form a cover film. The printing plate thus obtained was stored in a dark place for 10 days.

Thereafter, the cover film was peeled off from the printing plate, a gray scale negative film for measurement of sensitivity and a negative film for measurement of image reproduction (having 133 lines, 3%, 5% and 10% dots, independent points having diameters of 200 and 300$\mu$ and fine lines having widths of 50 and 70$\mu$) were adhered thereto under vacuum and exposed to a light from a high-pressure mercury lamp for 2 min.

Thereafter, the development was effected using a spray-type development device containing neutral water at 30° C. under a water pressure of 3 kg/cm². After 4 min, non-image areas were washed out completely by water to obtain a relief image. The resulting relief was examined to reveal that up to the 17th step remained in the gray scale to indicate that the sensitivity thereof was very high. It was recognized that the image area was reproduced sharply including very fine portions including 3% dots, 200μ independent points and 50μ fine lines.

The printing tests were effected using the thus obtained printing plates. A sharp print was obtained without widening of the printing area. The printing was effected to obtain 300,000 copies continuously. No problem of peeling of the relief nor crack formation was posed.

COMPARATIVE EXAMPLE 1

A photosensitive resin printing plate was prepared in the same manner as in Example 1 except that the addition of 10 parts by weight of the copolymer of diethylaminoethyl methacrylate and 2-hydroxyethyl acrylate (weight ratio: 1/1) was omitted. The printing plate was exposed and developed under the same conditions as in Example 1. A time of 6 min was required for the development which was about 1.5-folds as long as that required in Example 1. Therefore, fine lines having a width of 50μ were distorted seriously by the developing water during the development. In the gray scale, only up to the 15th step remained to indicate that the sensitivity was lower than that obtained in Example 1.

EXAMPLE 2

Printing plates were prepared from a photosensitive resin under the same conditions as in Example 1 except that the amount of the copolymer of diethylaminoethyl methacrylate and 2-hydroxyethyl acrylate (weight ratio: 1/1) was reduced from 10 parts by weight to 3 parts by weight. The printing plates were exposed and developed under the same conditions as in Example 1 and Comparative Example 1. The results are shown in the following table:

| Amount of component C added (parts by weight) | Development time (min) | Gray scale | Cracks in the relief in the printing step to obtain 300,000 copies continuously |
| --- | --- | --- | --- |
| 0 | 6 | 15 | formed |
| 3 | 4.5 | 16 | not formed |
| 10 | 4 | 17 | not formed |

It is understood from the resultS that the water developability and sensitivity are reduced as the amount of the dimethylaminoethyl methacrylate/2-hydroxyethyl acrylate copolymer is reduced but with at least 3 parts by weight of the copolymer, the water development velocity and the gray scale value are superior to those obtained without using the copolymer.

EXAMPLE 3

100 parts by weight of a partially saponified polyvinyl acetate having a degree of saponfication of 88 molar % and a degree of polymerization of 1500 was dissolved in 200 parts by weight of a solvent mixture of ethanol and water (weight ratio: 30/70) at 80° C. 2 parts by weight of glycidyl methacrylate was added to the solution and the reaction was carried out at 80° C. for 1 h. From the results of potentiometric titration analysis, it was found that the terminal carboxyl group of the partially saponified polyvinyl acetate had disappeared and an unsaturated bond was introduced in the polymer terminal by the reaction with the epoxy group of glycidyl methacrylate. Then, 50 parts of an unsaturated compound having the following structure obtained by the addition reaction of glycidyl methacrylate with acrylic acid was added thereto as a photopolymerizable monomer:

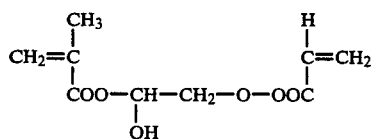

The mixture was further stirred thoroughly together with 20 parts by weight of a copolymer of dimethylaminoethyl methacrylate and 2-hydroxyethyl methacrylate (weight ratio: 2/1), 10 parts by weight of trimethylolpropane used as a compatibilization assistant, 3 parts by weight of benzoin ethyl ether used as a photosensitizer and 0.1 part by weight of t-butylcatechol used as a heat stabilizer.

The resulting photosensitive resin solution was spread on a steel base having 250μ thickness to which an epoxy adhesive had been applied and cured in such a manner that the resin film thickness after drying would be 950μ (including the thickness of the base). They were kept in an oven at 60° C. for 4 h to remove the solvent.

The resulting printing plate was exposed to a light of a chemical lamp through the same negative film as in Example 1 for 4 min and then developed in a spray-type development device using neutral water at 30° C. under a water pressure of 3 kg/cm². The development time was 3.5 min. The resulting relief was examined to reveal that up to the 17th step remained in the gray scale to indicate that the sensitivity thereof was very high. Fine lines having 50μ width were reproduced clearly. No crack was formed at all in the course of the printing test.

EXAMPLE 4

100 parts by weight of a partially saponified polyvinyl acetate having a degree of saponification of 75 molar % and an average degree of polymerization of 900 was dissolved in 300 parts by weight of a solvent mixture of ethanol/water (weight ratio: 60/40) under heating to 80° C. Then, 100 parts by weight of 3-chloro-2-hydroxyethyl acrylate used as a photopolymerizable unsaturated compound and 20 parts by weight of ethylene glycol diacrylate were added to the solution. Further, 30 parts by weight of dimethylaminoethyl acrylate homopolymer was added thereto.

Then, 4 parts by weight of benzophenone used as a photosensitizer and 0.01 part by weight of hydroquinone used as a heat polymerization inhibitor were added thereto and the mixture was stirred thoroughly.

The thus obtained photosensitive resin solution was spread on an aluminum base having 350μ thickness to which an epoxy adhesive had been applied in such a manner that the thickness after drying would be 700μ (including the thickness of the base). They were kept in an oven at 60° C. for 2 h to remove the solvent.

The resulting printing plate was exposed and developed under the same conditions as in Example 1. After a development time of 2 min, the resin in non-exposed areas was removed completely. The resulting relief was examined to reveal that up to the 16th step remained in the gray scale to indicate that the sensitivity thereof was very high. The relief was sharp and the 3% dots, 200μ independent points and 50μ fine lines were reproduced completely. In the printing test, no peeling of the relief nor crack formation was caused after printing 500,000 copies continuously.

What is claimed is:

1. A water-developable, photosensitive resin composition consisting essentially of:
   (a) 100 parts by weight based upon said composition of a completely or partially saponified polyvinyl acetate having a degree of saponification of more than 50 mole % and an average degree of polymerization in the range of 500 to 3000;
   (b) 20 to 300 parts by weight based upon said composition of a photopolymerizable monomer having at least one ethylenically unsaturated bond in the molecule, said unsaturated monomer being selected from the group consisting of an acrylate, methacrylate, acrylamide and methacrylamide;
   (c) 1 to 50 parts by weight based upon said composition of a copolymer comprising a polymerizable unsaturated monomer selected from the group consisting of an acrylate, methacrylate, acrylamide and methacrylamide each having a dialkylaminoalkyl group in the molecule, and an unsaturated monomer selected from the group consisting of an acrylate and methacrylate each having a hydroxyl group; and
   (d) a photosensitizer.

2. A photosensitive resin composition according to claim 1 wherein the partially saponified polyvinyl acetate A has a degree of saponification of 70 to 95 mole %.

3. A photosensitive resin composition according to claim 1 wherein a terminal of the completely or partially saponified polyvinyl acetate A has been reacted with glycidyl methacrylate.

4. A photosensitive resin composition according to claim 1 wherein the component B is an acrylate or methacrylate having a hydroxyl group and 1 to 6 double bonds.

5. A photosensitive resin composition according to claim 1 wherein the component B is an acrylamide or methacrylamide having 1 to 6 double bonds.

6. A photosensitive resin composition according to claim 1 wherein the component (c) is a copolymer comprising more than 10 wt. % based upon said copolymer of a polymerizable unsaturated monomer selected from the group consisting of a dialkylaminoalkyl acrylate, dialkylaminoalkyl methacrylate, dialkylaminoalkyl acrylamide and dialkylaminoalkyl methacrylamide.

7. A photosensitive resin composition according to claim 1 wherein the amount of the component C is 2 to 20 parts by weight per 100 parts by weight of the component A.

8. A photosensitive resin composition according to claim 1 which further comprises less than 30 wt. % based upon said composition of a dihydric to hexahydric alcohol compound as a compatibilization assistant for the components (a) and (c).

* * * * *